(12) United States Patent
Satoskar et al.

(10) Patent No.: US 9,780,800 B1
(45) Date of Patent: Oct. 3, 2017

(54) MATCHING PATHS IN A MULTIPLE PATH ANALOG-TO-DIGITAL CONVERTER

(71) Applicant: Cirrus Logic International Semiconductor Ltd., Edinburgh (GB)

(72) Inventors: Aniruddha Satoskar, Austin, TX (US); Daniel J. Allen, Austin, TX (US); Edmund Mark Schneider, Austin, TX (US); Saurabh Singh, Cedar Park, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/269,043

(22) Filed: Sep. 19, 2016

(51) Int. Cl.
*H03M 1/06* (2006.01)

(52) U.S. Cl.
CPC ....... *H03M 1/0626* (2013.01); *H03M 1/0607* (2013.01); *H03M 1/0612* (2013.01)

(58) Field of Classification Search
CPC ............. H03M 1/0626; H03M 1/0612; H03M 1/0607; H03M 1/1215
USPC .......................................... 341/118, 120, 155
See application file for complete search history.

(56) References Cited

U.S. PATENT DOCUMENTS

| 4,446,440 | A | 5/1984 | Bell |
| 4,493,091 | A | 1/1985 | Gundry |
| 4,890,107 | A | 12/1989 | Pearce |
| 4,972,436 | A | 11/1990 | Halim et al. |
| 4,999,628 | A | 3/1991 | Kakaubo et al. |
| 4,999,830 | A | 3/1991 | Agazzi |
| 5,077,539 | A | 12/1991 | Howatt |
| 5,148,167 | A | 9/1992 | Ribner |
| 5,198,814 | A | 3/1993 | Ogawara et al. |
| 5,321,758 | A | 6/1994 | Charpentier et al. |

(Continued)

FOREIGN PATENT DOCUMENTS

| EP | 0966105 A2 | 12/1999 |
| EP | 1575164 A2 | 9/2005 |

(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.

(Continued)

*Primary Examiner* — Khai M Nguyen
(74) *Attorney, Agent, or Firm* — Jackson Walker L.L.P.

(57) ABSTRACT

A method may include processing an analog input signal with a first processing path configured to generate a first digital signal based on the analog input signal; processing the analog input signal with a second processing path configured to generate a second digital signal based on the analog input signal, and adapting a response of an adaptive filter configured to generate a filtered digital signal from the second digital signal to reduce a difference between the filtered digital signal and the first digital signal. The method may additionally or alternatively include determining non-linearities present in the second processing path based on comparison of the first digital signal and the second digital signal, and applying a linear correction to the second digital signal to generate a corrected second digital signal with decreased nonlinearity from that of the second digital signal.

12 Claims, 5 Drawing Sheets

(56) References Cited

U.S. PATENT DOCUMENTS

| | | |
|---|---|---|
| 5,323,159 A | 6/1994 | Imamura et al. |
| 5,343,161 A | 8/1994 | Tokumo et al. |
| 5,550,923 A | 8/1996 | Hotvet et al. |
| 5,600,317 A | 2/1997 | Knoth et al. |
| 5,714,956 A | 2/1998 | Jahne et al. |
| 5,719,641 A | 2/1998 | Mizoguchi |
| 5,808,575 A | 9/1998 | Himeno et al. |
| 5,810,477 A | 9/1998 | Abraham et al. |
| 6,088,461 A | 7/2000 | Lin |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,683,494 B2 | 1/2004 | Stanley |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 | 10/2007 | Bolz et al. |
| 7,302,354 B2 | 11/2007 | Zhuge |
| 7,312,734 B2 * | 12/2007 | McNeill ............. H03M 1/1004 341/120 |
| 7,315,204 B2 | 1/2008 | Seven |
| 7,365,664 B2 | 4/2008 | Caduff et al. |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,893,856 B2 | 2/2011 | Ek et al. |
| 8,060,663 B2 | 11/2011 | Murray et al. |
| 8,130,126 B2 | 3/2012 | Breitschaedel et al. |
| 8,289,425 B2 | 10/2012 | Kanbe |
| 8,330,631 B2 | 12/2012 | Kumar et al. |
| 8,362,936 B2 | 1/2013 | Ledzius et al. |
| 8,483,753 B2 | 7/2013 | Behzad et al. |
| 8,508,397 B2 * | 8/2013 | Hisch ............. H03M 1/188 341/155 |
| 8,717,211 B2 | 5/2014 | Miao et al. |
| 8,786,477 B1 | 7/2014 | Albinet |
| 8,836,551 B2 * | 9/2014 | Nozaki ............. H03M 1/0626 341/118 |
| 8,873,182 B2 | 10/2014 | Liao et al. |
| 8,878,708 B1 | 11/2014 | Sanders et al. |
| 8,952,837 B2 | 2/2015 | Kim et al. |
| 9,071,267 B1 | 6/2015 | Schneider et al. |
| 9,071,268 B1 | 6/2015 | Schneider et al. |
| 9,118,401 B1 | 8/2015 | Nieto et al. |
| 9,148,164 B1 | 9/2015 | Schneider et al. |
| 9,171,552 B1 | 10/2015 | Yang |
| 9,210,506 B1 | 12/2015 | Nawfal et al. |
| 9,306,588 B2 | 4/2016 | Das et al. |
| 9,337,795 B2 | 5/2016 | Das et al. |
| 9,391,576 B1 | 7/2016 | Satoskar et al. |
| 9,525,940 B1 | 12/2016 | Schneider et al. |
| 9,543,975 B1 | 1/2017 | Melanson et al. |
| 9,584,911 B2 | 2/2017 | Das et al. |
| 9,596,537 B2 | 3/2017 | He et al. |
| 9,635,310 B2 | 4/2017 | Chang et al. |
| 2001/0001547 A1 | 5/2001 | Delano et al. |
| 2001/0009565 A1 | 7/2001 | Singvall |
| 2004/0078200 A1 | 4/2004 | Alves |
| 2004/0184621 A1 | 9/2004 | Andersen et al. |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1 | 3/2006 | Shalon et al. |
| 2006/0098827 A1 | 5/2006 | Paddock et al. |
| 2006/0284675 A1 | 12/2006 | Krochmal et al. |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2008/0030577 A1 | 2/2008 | Cleary et al. |
| 2008/0114239 A1 | 5/2008 | Randall et al. |
| 2008/0143436 A1 | 6/2008 | Xu |
| 2008/0159444 A1 | 7/2008 | Terada |
| 2008/0198048 A1 | 8/2008 | Klein et al. |
| 2008/0292107 A1 | 11/2008 | Bizjak |
| 2009/0021643 A1 | 1/2009 | Hsueh et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1 | 8/2011 | Anderson et al. |
| 2011/0228952 A1 | 9/2011 | Lin |
| 2011/0242614 A1 | 10/2011 | Okada |
| 2011/0268301 A1 | 11/2011 | Nielsen et al. |
| 2011/0285463 A1 | 11/2011 | Walker et al. |
| 2012/0001786 A1 | 1/2012 | Hisch |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0280726 A1 | 11/2012 | Colombo et al. |
| 2013/0095870 A1 | 4/2013 | Phillips et al. |
| 2013/0106635 A1 | 5/2013 | Doi |
| 2013/0129117 A1 | 5/2013 | Thomsen et al. |
| 2013/0188808 A1 | 7/2013 | Pereira et al. |
| 2013/0241753 A1 | 9/2013 | Nozaki |
| 2013/0241755 A1 | 9/2013 | Chen et al. |
| 2014/0044280 A1 | 2/2014 | Jiang |
| 2014/0105256 A1 | 4/2014 | Hanevich et al. |
| 2014/0105273 A1 | 4/2014 | Chen et al. |
| 2014/0126747 A1 | 5/2014 | Huang |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2014/0368364 A1 | 12/2014 | Hsu |
| 2015/0009079 A1 | 1/2015 | Bojer |
| 2015/0170663 A1 | 6/2015 | Disch et al. |
| 2015/0214974 A1 | 7/2015 | Currivan |
| 2015/0214975 A1 | 7/2015 | Gomez et al. |
| 2015/0249466 A1 | 9/2015 | Elyada |
| 2015/0295584 A1 | 10/2015 | Das et al. |
| 2015/0381130 A1 | 12/2015 | Das et al. |
| 2016/0072465 A1 | 3/2016 | Das et al. |
| 2016/0080862 A1 | 3/2016 | He et al. |
| 2016/0080865 A1 | 3/2016 | He et al. |
| 2016/0173112 A1 | 6/2016 | Das et al. |
| 2016/0286310 A1 | 9/2016 | Das et al. |
| 2016/0365081 A1 | 12/2016 | Satoskar et al. |
| 2017/0047895 A1 | 2/2017 | Zanbaghi |
| 2017/0150257 A1 | 5/2017 | Das et al. |

FOREIGN PATENT DOCUMENTS

| | | |
|---|---|---|
| EP | 1753130 A1 | 2/2007 |
| EP | 1798852 A | 6/2009 |
| EP | 2207264 A1 | 7/2010 |

(56) References Cited

FOREIGN PATENT DOCUMENTS

| GB | 1599401 | A | 9/1981 |
|---|---|---|---|
| GB | 2119189 | A | 11/1983 |
| GB | 2307121 | A | 6/1997 |
| GB | 2507096 | A | 4/2014 |
| GB | 2527637 | A | 12/2015 |
| GB | 2527677 | B | 10/2016 |
| GB | 2539517 | A | 12/2016 |
| JP | 2008294803 | A | 12/2008 |
| WO | WO0054403 | A1 | 9/2000 |
| WO | 02/37686 | A2 | 5/2002 |
| WO | 2008067260 | A1 | 6/2008 |
| WO | 2014113471 | A1 | 7/2014 |
| WO | 2015160655 | A1 | 10/2015 |
| WO | 2016040165 | A1 | 3/2016 |
| WO | 2016040171 | A1 | 3/2016 |
| WO | 2016040177 | A1 | 3/2016 |
| WO | 2016160336 | A1 | 10/2016 |
| WO | 2016202636 | A1 | 12/2016 |

OTHER PUBLICATIONS

Thaden, Rainer et al., A Loudspeaker Management System with FIR/IIR Filtering; Slides from a presentation given at the 32nd AES conference "DSP for Loudspeakers" in Hillerod, Denmark in Sep. 2007; http://www.four-audio.com/data/AES32/AES32FourAudio. pdf; 23 pages.
GB Patent Application No. 1419651.3, Improved Analogue-to-Digital Convertor, filed Nov. 4, 2014, 65 pages.
Combined Search and Examination Report, GB Application No. GB1506258.1, Oct. 21, 2015, 6 pages.
International Search Report and Written Opinion, International Patent Application No. PCT/US2015/025329, mailed Aug. 11, 2015, 9 pages.
International Search Report and Written Opinion, International Patent Application No. PCT/US2015/048633, mailed Dec. 10, 2015, 11 pages.
International Search Report and Written Opinion, International Patent Application No. PCT/US2015/048591, mailed Dec. 10, 2015, 11 pages.
Combined Search and Examination Report, GB Application No. GB1510578.6, Aug. 3, 2015, 3 pages.
International Search Report and Written Opinion, International Application No. PCT/US2015/056357, mailed Jan. 29, 2015, 13 pages.
Combined Search and Examination Report, GB Application No. GB1514512.1, Feb. 11, 2016, 7 pages.
International Search Report and Written Opinion, International Application No. PCT/US2015/048609, mailed Mar. 23, 2016, 23 pages.
International Search Report and Written Opinion, International Application No. PCT/US2016/022578, mailed Jun. 22, 2016, 12 pages.
Combined Search and Examination Report, GB Application No. GB1600528.2, Jul. 7, 2016, 8 pages.
Combined Search and Examination Report, GB Application No. GB1603628.7, Aug. 24, 2016, 6 pages.
International Search Report and Written Opinion, International Application No. PCT/EP2016/062862, mailed Aug. 26, 2016, 14 pages.
Combined Search and Examination Report, GB Application No. GB1602288.1, Aug. 9, 2016, 6 pages.
International Search Report and Written Opinion of the International Searching Authority, International Application No. PCT/US2016/065134, mailed Mar. 15, 2017.
International Search Report and Written Opinion of the International Searching Authority, International Application No. PCT/US2016/040096, mailed Mar. 24, 2017.
International Search Report and Written Opinion of the International Searching Authority, International Application No. PCT/US2017/014240, dated Apr. 24, 2017.
Combined Search and Examination Report under Sections 17 and 18(3) of the UKIPO, Application No. GB1620427.3, dated Jun. 1, 2017.
Combined Search and Examination Report under Sections 17 and 18(3) of the UKIPO, Application No. GB1620428.1, dated Jul. 21, 2017.
Combined Search and Examination Report under Sections 17 and 18(3), United Kingdom Intellectual Property Office, Application No. GB1700371.6, dated Aug. 1, 2017.

\* cited by examiner

MATCHING PATHS IN A MULTIPLE PATH ANALOG-TO-DIGITAL CONVERTER

FIELD OF DISCLOSURE

The present disclosure relates in general to signal processing systems, and more particularly, to multiple path signal processing systems.

BACKGROUND

The use of multipath analog-to-digital converters (ADCs) and analog front ends (AFEs) (e.g., two or more path ADCs/AFEs) in electrical circuits is known. Example multipath ADCs and AFEs and use of them in multiple electrical circuit paths are disclosed in U.S. Pat. No. 5,714,956 entitled "Process and System for the Analog-to-Digital Conversion of Signals" to Jahne et al. ("Jahne patent"), U.S. Pat. No. 5,600,317 entitled "Apparatus for the Conversion of Analog Audio Signals to a Digital Data Stream" to Knoth et al. ("Knoth patent") and U.S. Pat. No. 6,271,780 entitled "Gain Ranging Analog-to-Digital Converter with Error Correction" to Gong et al. ("Gong patent"). The use of multipath circuits may reduce noise as one path may be optimized for processing small amplitude signals (e.g., for processing low noise signals) while another circuit path with another set of ADC and AFE is optimized for large amplitude signals (e.g., allowing for higher dynamic range).

An example application for multipath ADCs/AFEs is use of it in a circuit for an audio system application, such as an audio mixing board or in a digital microphone system. Such an example application is disclosed in the Jahne patent. In designing a circuit with multipath ADCs/AFEs that are used in respective multiple circuit paths, a tradeoff may exist between allowing larger signal swing (e.g., to allow swing of a signal between larger scale amplitudes) and low noise. Furthermore, the multipath ADCs/AFEs may provide high dynamic range signal digitization, with higher dynamic range for a given input power, and lower overall area than would be possible with conventional means. In other words, by allowing a separate optimization for each type of signal (e.g., large and small signals) that is provided each respective path, multipath ADCs/AFEs allow the overall circuit to burn less power, consume less area, and save on other such design costs.

Despite their advantages, existing multipath ADC/AFE approaches have disadvantages and problems. For example, many existing approaches have disadvantages related to transitioning and switching between the multiple paths, as such switching may not be smooth, leading to undesirable signal artifacts, especially in audio applications in which such artifacts may be perceptible to a listener of an audio device. As another example, a trend in electric circuits is to scale circuitry to the integrated circuit level. However, existing approaches to multipath AFEs/ADCs do not scale well to the integrated circuit level.

SUMMARY

In accordance with the teachings of the present disclosure, certain disadvantages and problems associated with implementation of multiple AFE/ADC paths may be reduced or eliminated.

In accordance with embodiments of the present disclosure, a processing system may include a plurality of processing paths including a first processing path and a second processing path, and an adaptive filter. The first processing path may be configured to generate a first digital signal based on an analog input signal and the second processing path is configured to generate a second digital signal based on the analog input signal. The adaptive filter may be configured to generate a filtered digital signal from the second digital signal and adapt its response to reduce a difference between the filtered digital signal and the first digital signal.

In accordance with these and other embodiments of the present disclosure, a method may include processing an analog input signal with a first processing path configured to generate a first digital signal based on the analog input signal; processing the analog input signal with a second processing path configured to generate a second digital signal based on the analog input signal, and adapting a response of an adaptive filter configured to generate a filtered digital signal from the second digital signal to reduce a difference between the filtered digital signal and the first digital signal.

In accordance with these and other embodiments of the present disclosure, a processing system may include a plurality of processing paths including a first processing path and a second processing path, and a linear correction subsystem. The first processing path may be configured to generate a first digital signal based on an analog input signal. The second processing path may be configured to generate a second digital signal based on the analog input signal. The linear correction subsystem may be configured to determine nonlinearities present in the second processing path based on comparison of the first digital signal and the second digital signal and apply a linear correction to the second digital signal to generate a corrected second digital signal with decreased nonlinearity from that of the second digital signal.

In accordance with these and other embodiments of the present disclosure, a method may include processing an analog input signal with a first processing path configured to generate a first digital signal based on the analog input signal, processing the analog input signal with a second processing path configured to generate a second digital signal based on the analog input signal, determining nonlinearities present in the second processing path based on comparison of the first digital signal and the second digital signal, and applying a linear correction to the second digital signal to generate a corrected second digital signal with decreased nonlinearity from that of the second digital signal.

In accordance with these and other embodiments of the present disclosure, a processing system may include a plurality of processing paths including a first processing path and a second processing path and a controller. The first processing path may include a first analog front end and a first digital processing subsystem having a first analog-to-digital converter, wherein the first analog front end is configured to amplify an analog input signal in accordance with a first analog gain in order to generate a first amplified analog signal and the first analog-to-digital converter is configured to convert the first amplified analog signal into a first digital signal. The second processing path may include a second analog front end and a second digital processing subsystem having a second analog-to-digital converter, wherein the second analog front end is configured to amplify the analog input signal in accordance with a second analog gain in order to generate a second amplified analog signal and the second analog-to-digital converter is configured to convert the second amplified analog signal into a second digital signal. The controller may be configured to generate a digital output signal of the processing system from one or both of the first digital signal and the second digital signal based on a magnitude of the analog input signal and set the first analog gain based on the magnitude of the analog input when the digital output signal is generated from the second digital signal.

In accordance with these and other embodiments of the present disclosure, a method may include processing an analog input signal with a first processing comprising a first analog front end and a first digital processing subsystem having a first analog-to-digital converter, wherein the first analog front end is configured to amplify the analog input signal in accordance with a first analog gain in order to generate a first amplified analog signal and the first analog-to-digital converter is configured to convert the first amplified analog signal into a first digital signal. The method may also include processing the analog input signal with a second processing path comprising a second analog front end and a second digital processing subsystem having a second analog-to-digital converter, wherein the second analog front end is configured to amplify the analog input signal in accordance with a second analog gain in order to generate a second amplified analog signal and the second analog-to-digital converter is configured to convert the second amplified analog signal into a second digital signal. The method may further include generating a digital output signal of the processing system from one or both of the first digital signal and the second digital signal based on a magnitude of the analog input signal and setting the first analog gain based on the magnitude of the analog input when the digital output signal is generated from the second digital signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
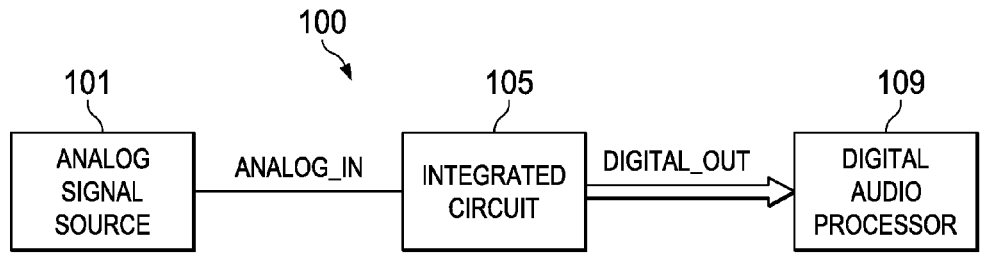
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital processor 109. Analog signal source 101 may comprise any system, device, or apparatus configured to generate an analog electrical signal, for example an analog input signal ANALOG_IN. For example, in embodiments in which signal processing system 100 is a processing system, analog signal source 101 may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package.

Digital processor 109 may comprise any suitable system, device, or apparatus configured to process a digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
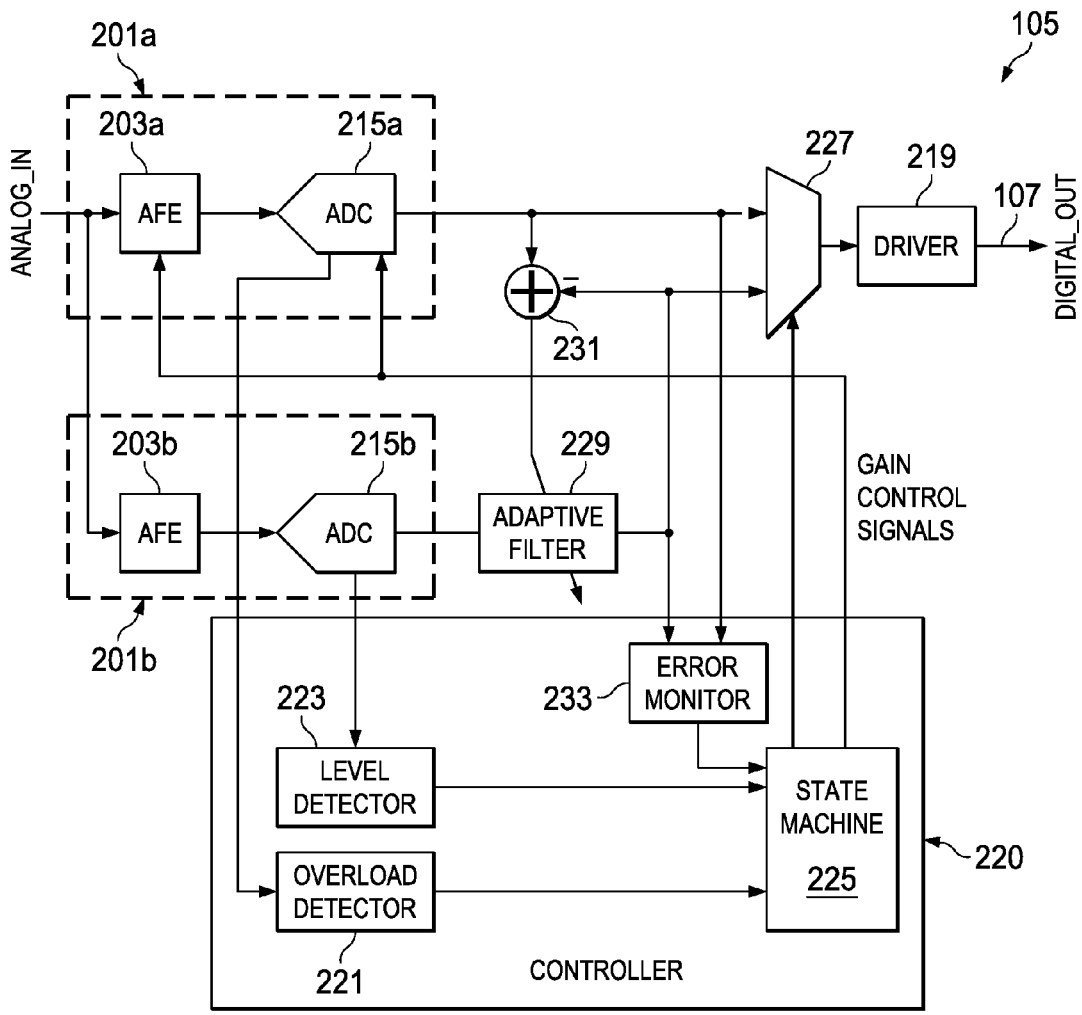
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include two or more processing paths 201a and 201b (which may be referred to herein individually as a processing path 201 and collectively as processing paths 201), each processing path 201 including a respective AFE 203 (e.g., AFE 203a, AFE 203b) and a respective ADC (e.g., ADC 215a, ADC 215b). An AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. Selected components for example embodiments of AFEs 203*a* and 203*b* are discussed in greater detail below with respect to FIG. 3. The output of each AFE 203 may be communicated to a respective ADC 215 on one or more output lines.

An ADC 215 may comprise any suitable system, device, or apparatus configured to convert an analog signal received at its input, to a digital signal representative of analog input signal ANALOG_IN. ADC 215 may itself include one or more components (e.g., delta-sigma modulator, decimator, etc.) for carrying out the functionality of ADC 215. Selected components for the example embodiments of ADCs 215*a* and 215*b* are discussed in greater detail below with respect to FIG. 3.

A combiner 231 may receive a respective digital signal from each of processing paths 201 and may generate a resulting error signal representing a difference between the digital signals generated by processing paths 201.

An adaptive filter 229 may receive the digital signal generated by processing path 201*b* and the error signal generated by combiner 231 to generate a filtered digital signal and apply an adaptive response to the digital signal in order to reduce the error between the filtered digital signal and the digital signal generated by processing path 201*a*. Accordingly, adaptive filter 229 may comprise any suitable adaptive filter, including a least-mean-squares adaptive filter designed to adapt its response to reduce the error between the filtered digital signal and the digital signal generated by processing path 201*a*.

A multiplexer 227 may receive the digital signal generated by processing path 201*a* and the filtered digital signal generated by adaptive filter 229 and may select one of such digital signals as digital output signal DIGITAL_OUT based on a control signal generated by and communicated from a controller 220.

Driver 219 may receive the digital signal DIGITAL_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIGITAL_OUT for transmission over a bus to digital processor 109. In FIG. 2, the bus receiving digital output signal DIGITAL_OUT is shown as single-ended. In some embodiments, driver 219 may generate a differential digital output signal 107.

Controller 220 may comprise any suitable system, device, or apparatus for selecting one of the digital signals output by the various processing paths 201 as digital output signal DIGITAL_OUT. In some embodiments, controller 220 may make such selection based on a magnitude of analog input signal ANALOG_IN or a signal derivative thereof. For example, controller 220 may include an overload detector 221 that may determine whether or not a signal derivative of analog input signal ANALOG_IN (e.g., an output of a modulator 316*a* of delta-sigma modulator 308*a*, as shown in greater detail in FIG. 3) is likely to cause clipping or other distortion of digital output signal DIGITAL_OUT if a particular processing path (e.g., processing path 201*a*) is selected. If clipping or other distortion of digital output signal DIGITAL_OUT is likely if the particular processing path (e.g., processing path 201*a*) is selected, state machine 225 of controller 220 may generate a control signal so that another processing path (e.g., processing path 201*b*, as filtered by adaptive filter 229) is selected. To further illustrate, in some embodiments, processing path 201*a* may be a path adapted for low amplitudes of analog input signal ANALOG_IN and may thus have a high signal gain, while processing path 201*b* may be a path adapted for higher amplitudes of analog input signal ANALOG_IN and may thus have a lower signal gain. Thus, if analog input signal ANALOG_IN or a derivative thereof is greater than a threshold value indicative of a condition whereby digital output signal DIGITAL_OUT may experience clipping or other distortion if processing path 201*a* is selected, overload detector 221 may detect such condition, and cause state machine 225 to generate a control signal to select the digital signal generated by processing path 201*b* (as filtered by adaptive filter 229) as digital output signal DIGITAL_OUT.

As another example, controller 220 may include a level detector 223 that may detect an amplitude of analog input signal ANALOG_IN or a signal derivative thereof (e.g., a signal generated within ADC 215*b*) and communicate a signal indicative of such amplitude to state machine 225. Responsive to the signal received from level detector 223, state machine 225 may generate the control signal communicated to multiplexer 227. To illustrate, as analog input signal ANALOG_IN decreases from a relatively high amplitude to a lower amplitude, it may cross a threshold amplitude level whereby controller 220 may change the selection of digital output signal DIGITAL_OUT from the digital signal generated by processing path 201*b* (as filtered by adaptive filter 229 and which may be adapted for higher amplitudes of analog input signal ANALOG_IN) to the digital signal generated by processing path 201*a* (which may be adapted for lower amplitudes of analog input signal ANALOG_IN). In some embodiments, a threshold amplitude level whereby controller 220 may change the selection of digital output signal DIGITAL_OUT from the digital signal generated by processing path 201*b* (as filtered by adaptive filter 229) to the digital signal generated by processing path 201*a* may be lower than another threshold amplitude level whereby controller 220 may change the selection of digital output signal DIGITAL_OUT from the digital signal generated by processing path 201*a* to the digital signal generated by processing path 201*b*, in order to provide for hysteresis so that multiplexer 227 does not repeatedly switch between the paths.

As a further example, controller 220 may include an error monitor 233 that may monitor the error between the filtered digital signal generated by adaptive filter 229 and the digital signal generated by processing path 201*a*, and may generate a signal based on whether adaptation has converged (e.g., e.g., convergence of least-mean-squares adaption) and/or based on whether the error is below a threshold error level. Responsive to the signal received from error monitor 233, state machine 225 may generate the control signal communicated to multiplexer 227. To illustrate, in order for controller 220 to switch selection from the filtered digital signal generated by adaptive filter 229 to the digital signal generated by processing path 201*a*, in addition to all other conditions for such switch (e.g., magnitude of analog input signal ANALOG_IN being below a threshold magnitude), controller 220 may also determine that the error between the filtered digital signal generated by adaptive filter 229 and the digital signal generated by processing path 201*a* is below a threshold error level and that the least-mean-squares adaptation of adaptive filter 229 has converged.

Figure 3:
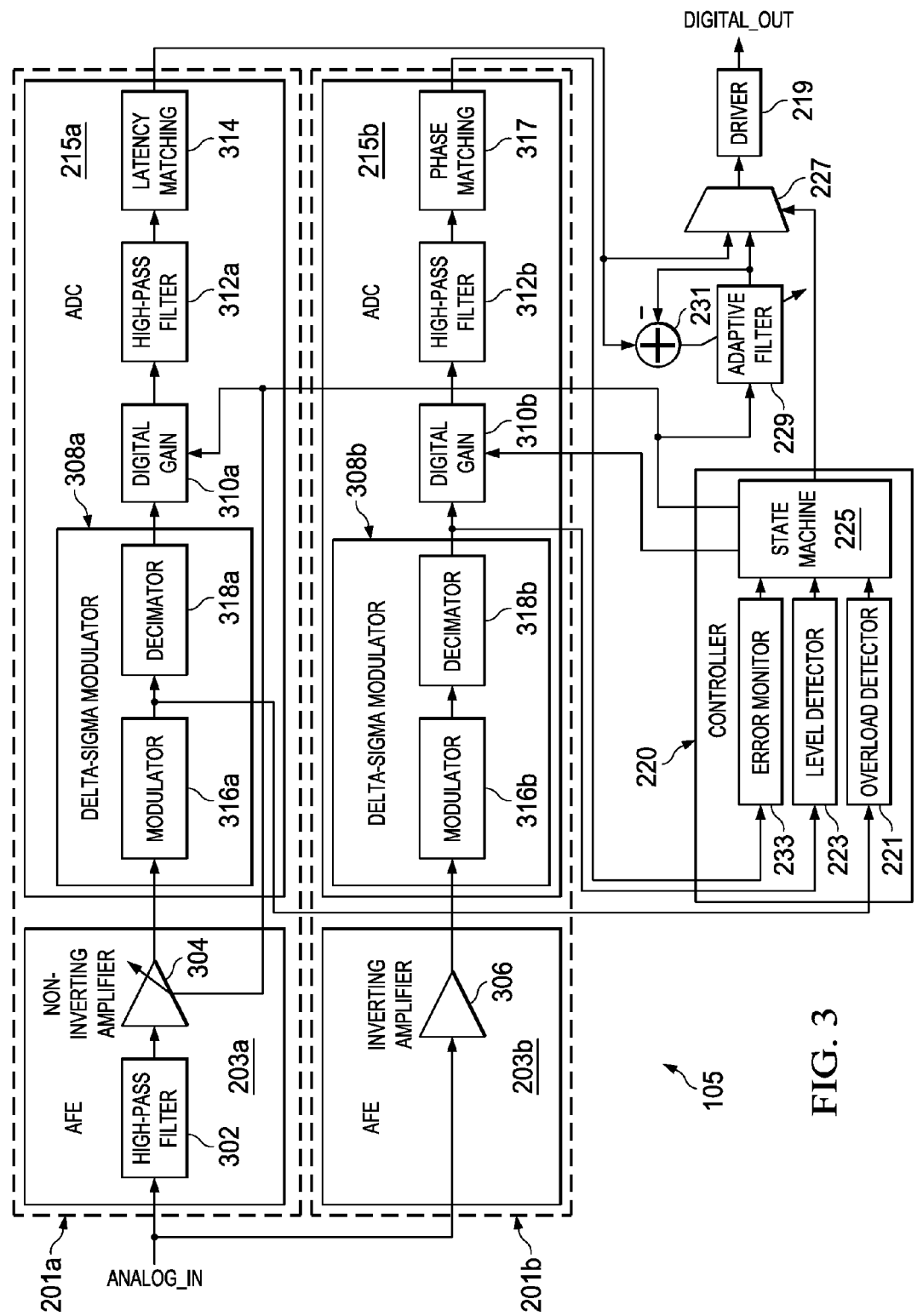
FIG. 3 illustrates a block diagram of selected components of the integrated circuit of FIG. 2 depicting selected components of example embodiments of analog front ends and analog-to-digital converters, in accordance with embodiments of the present disclosure.

FIG. 3 illustrates a block diagram of selected components of integrated circuit 105 depicting selected components of example embodiments of AFEs 203 and ADCs 215, in accordance with embodiments of the present disclosure. As shown in FIG. 3, analog front end 203a of processing path 201a may include a high-pass filter 302 configured to high-pass filter analog input signal ANALOG_IN to remove direct current offsets or biases, which are often particularly troublesome for high-gain amplifiers, and output such filtered signal to a non-inverting amplifier 304. Non-inverting amplifier 304 may amplify analog input signal ANALOG_IN by a non-inverting gain and communicate such amplified analog signal to ADC 215a. In some embodiments, high-pass filter 302 may be formed on the same integrated circuit as one or more of AFE 203a, AFE 203b, ADC 215a, and ADC 215b. Because of the presence of high-pass filter 302 in processing path 201a, but not processing path 201b, processing paths 201 may each have a different frequency response to analog input signal ANALOG_IN.

Also as shown in FIG. 3, analog front end 203b of processing path 201b may include an inverting amplifier 306 which may amplify analog input signal ANALOG_IN by an inverting gain and communicate such amplified analog signal to ADC 215b. In some embodiments, inverting amplifier 306 may be configured to apply a multiplicative gain of less than unity to analog input signal ANALOG_IN. By attenuating higher-amplitude signals, a greater dynamic range for analog input signal ANALOG_IN may be achieved, in spite of conventional wisdom that would generally dictate that signal loss should be avoided in a low-noise system. In these and other embodiments, although not depicted in FIG. 3, inverting amplifier 306 may receive the output of high-pass filter 302 instead of the unfiltered analog input signal ANALOG_IN.

Although AFEs 203a and 203b are described above having a non-inverting gain and an inverting gain, respectively, each of processing paths 201 may have approximately the same cumulative gain. Those of skill in the art may appreciate that simply applying a digital gain with a negative sign in either of ADC 215a or ADC 215b will negate the opposite polarities of the gains of AFEs 203.

As depicted in FIG. 3, each ADC 215 may include a respective delta-sigma modulator 308 (e.g., delta-sigma modulators 308a and 308b), a respective digital gain element 310 (e.g., digital gain elements 310a and 310b), and respective high-pass filters 312 (e.g., high-pass filters 312a and 312b). Each delta-sigma modulator 308 may be configured to modulate an analog signal into a corresponding digital signal. As known in the art, each delta-sigma modulator 308 may include a respective modulator 316 (e.g., modulators 316a, 316b) and a decimator 318 (e.g., decimators 318a, 318b). Each digital gain element 310 may apply a gain to a digital signal generated by its associated delta-sigma modulator 308. Each high-pass filter 312 may high-pass filter a digital signal generated by its associated digital gain element, to filter out any direct-current offsets present in the digital signal. High-pass filter 312b may also compensate for high-pass filter 302 present in AFE 203a.

In addition, ADC 215a may comprise a latency matching element 314 to match any signal latencies between processing path 201a and processing path 201b, while ADC 215b may comprise a phase matching element 317 to account for any phase offset between processing path 201a and processing path 201b. For example, phase matching element 317 may dynamically compensate for any phase mismatch between processing paths 201a and 201b by varying a delay of at least one of processing path 201a and processing path 201b. In some embodiments, phase matching element 317 may comprise a high-pass filter.

In some embodiments, a magnitude of a gain of non-inverting amplifier 304 may be substantially larger than (e.g., significantly more than manufacturing tolerances, one or more orders of magnitude) a magnitude of a gain of inverting amplifier 306. In addition, in these and other embodiments, a magnitude of digital gain element 310b may be substantially larger than (e.g., significantly more than manufacturing tolerances, one or more orders of magnitude) a magnitude of a gain of digital gain element 310a. Consequently, in such embodiments, a first path gain equal to the product of the magnitude of the gain of inverting amplifier 306 and the magnitude of a gain of digital gain element 310b may be substantially equal (e.g., within manufacturing tolerances) to a second path gain equal to the product of the magnitude of gain of non-inverting amplifier 304 and the gain of digital gain element 310a. As a specific example, in some embodiments, the inverting gain of inverting amplifier 306 may be approximately −6 decibels, the non-inverting gain of non-inverting amplifier 304 may be approximately 20 decibels, the gain of digital gain element 310a may be approximately −26 decibels, and the gain of digital gain element 310b may be approximately 0 decibels.

Accordingly, each processing path 201 may be adapted to process a particular amplitude of analog input signal ANALOG_IN. For example, AFE 203a may be suited to process lower signal amplitudes, as non-inverting amplifier 304 may have a practically infinite input resistance, may have a relatively low level of input-referred noise as compared to inverting amplifier 306, and its larger gain may permit effective processing of smaller signals, but characteristics of AFE 203a may not be amenable to higher amplitudes. The high input resistance of non-inverting amplifier 304 may facilitate the use of a smaller capacitor area for high-pass filter 302 (as compared to traditional approaches for implementing high-pass filters) and thus may permit integration of circuitry of high-pass filter 302 into the same integrated circuit as non-inverting amplifier 304, inverting amplifier 306, ADC 215a, and/or ADC 215b. In addition, the ability to integrate circuitry into a single integrated circuit may allow for centralized control of the stimuli for switching between processing paths 201 by controller 220, and may allow for more direct timing control of the actual switching and transitioning between processing paths 201. For example, because circuitry is integrated into a single integrated circuitry, level detector 223 may receive an output of delta-sigma modulator 308b as an input signal, rather than receiving an output of ADC 215b.

On the other hand, AFE 203b may be suited to process higher signal amplitudes, as its lower gain will reduce the likelihood of signal clipping, and may provide for greater dynamic range for analog input signal ANALOG_IN as compared to traditional approaches.

Figure 4:
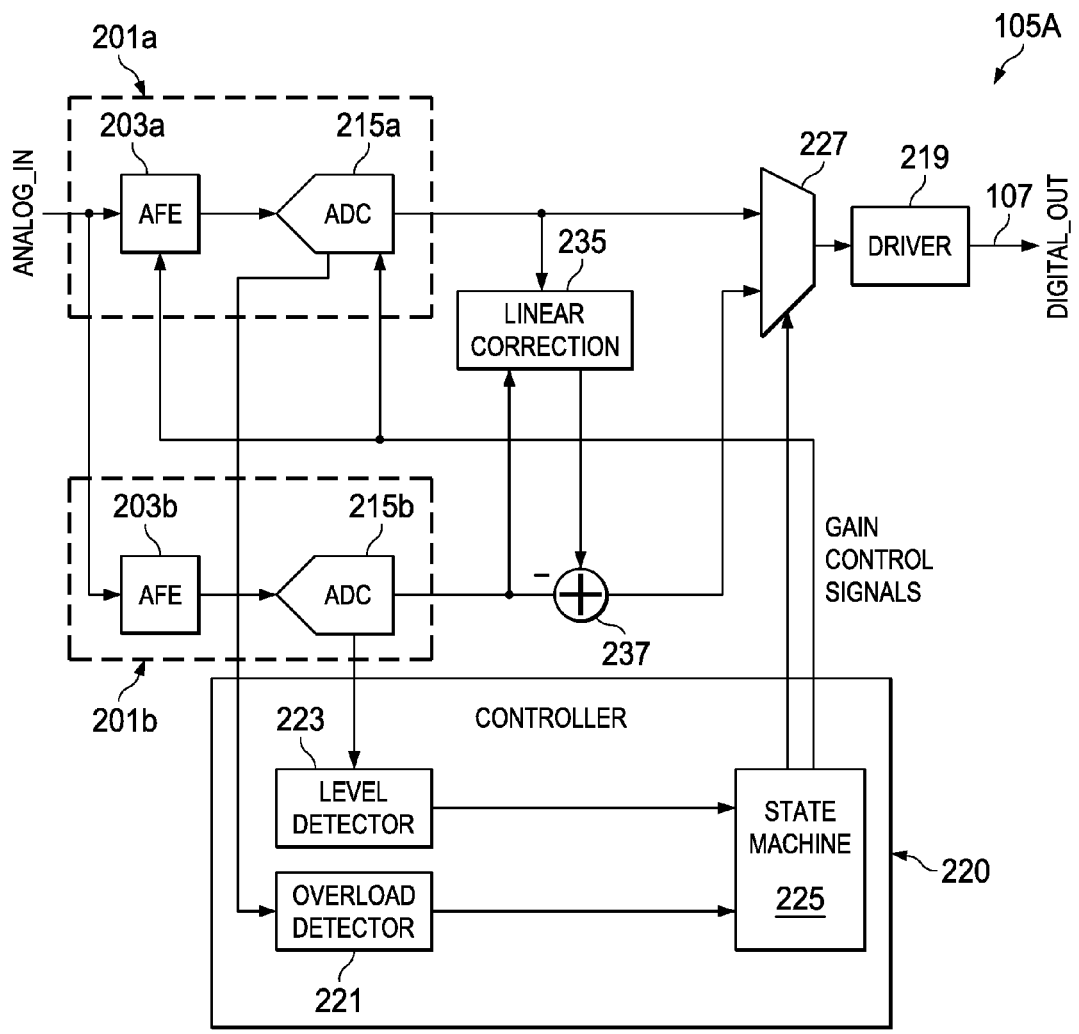
FIG. 4 illustrates a block diagram of selected components of another integrated circuit for processing an analog signal to generate a digital signal, in accordance with embodiments of the present disclosure.

FIG. 4 illustrates a block diagram of selected components of integrated circuit 105A, in accordance with embodiments of the present disclosure. Integrated circuit 105A as shown in FIG. 4 may be in many respects similar to integrated circuit 105 depicted in FIGS. 2 and 3, and thus only the significant differences between integrated circuit 105A and integrated circuit 105 may be described with respect to the discussion of FIG. 4. In particular, integrated circuit 105A may not include adaptive filter 229, combiner 231, and/or error monitor 233 of integrated circuit 105 depicted in FIGS. 2 and 3. However, integrated circuit 105A may include a linear correction subsystem comprising a linear correction circuit 235 and a combiner 237.

Linear correction circuit 235 may receive a respective digital signal from each of processing paths 201 and may determine nonlinearities present in the second processing path based on comparison of the respective digital signals and apply, via combiner 237, a linear correction to the digital signal generated by processing path 201b in order to generate a corrected digital signal with decreased nonlinearity from that of the digital signal generated by processing path 201b. Example implementations of linear correction circuit 235 are described in greater detail below with respect to FIG. 5.

Controller 220 may, based on one or more parameters (e.g., signals output by overload detector 221, level detector 223, etc.) select either the digital signal generated by processing path 201a as digital output signal DIGITAL_OUT or the corrected digital signal generated by the linear correction subsystem of linear correction circuit 235 and a combiner 237. For example, when the magnitude of analog input ANALOG_INPUT is greater than a threshold magnitude, controller 220 may select the corrected digital signal generated by the linear correction subsystem as digital output signal DIGITAL_OUT. On the other hand, when the magnitude of analog input ANALOG_INPUT is lesser than a threshold magnitude, controller 220 may select the digital signal generated by processing path 201a as digital output signal DIGITAL_OUT. Thus, whenever controller 220 selects the corrected digital signal generated by the linear correction subsystem as digital output signal DIGITAL_OUT, processing path 201a may still be utilized to correct for nonlinearities present in processing path 201b.

In some embodiments, to further improve the linearity of the processing system implemented by integrated circuit 105A, the analog gain and digital gain of processing path 201a (e.g., analog gain of non-inverting amplifier 304 and the digital gain of digital gain element 310a) may be reconfigured by gain control signals generated by state machine 225 based on whether controller 220 selects the corrected digital signal generated by the linear correction subsystem as digital output signal DIGITAL_OUT or selects the digital signal generated by processing path 201a as digital output signal DIGITAL_OUT. For example, when controller 220 selects the corrected digital signal generated by the linear correction subsystem as digital output signal DIGITAL_OUT, controller 220 may set the analog gain of processing path 201a substantially smaller than the analog gain of processing path 201b (and correspondingly increase the digital gain of processing path 201a to provide a unity gain for all of processing path 201a). Accordingly, when the magnitude of analog input signal ANALOG_IN is greater than a threshold magnitude, the analog gain of processing path 201a may be set substantially smaller than the analog gain of processing path 201b. By attenuating analog input signal ANALOG_IN with the analog gain of processing path 201a, harmonics present in processing path 201a may be reduced or eliminated. Furthermore, when magnitude of analog input signal ANALOG_IN is lesser than the threshold magnitude, the analog gain of processing path 201a may be set substantially larger than the analog gain of processing path 201b, thus allowing processing path 201a to more effectively process the lower-magnitude signal when its output is selected as digital output signal DIGITAL_OUT.

Figure 5:
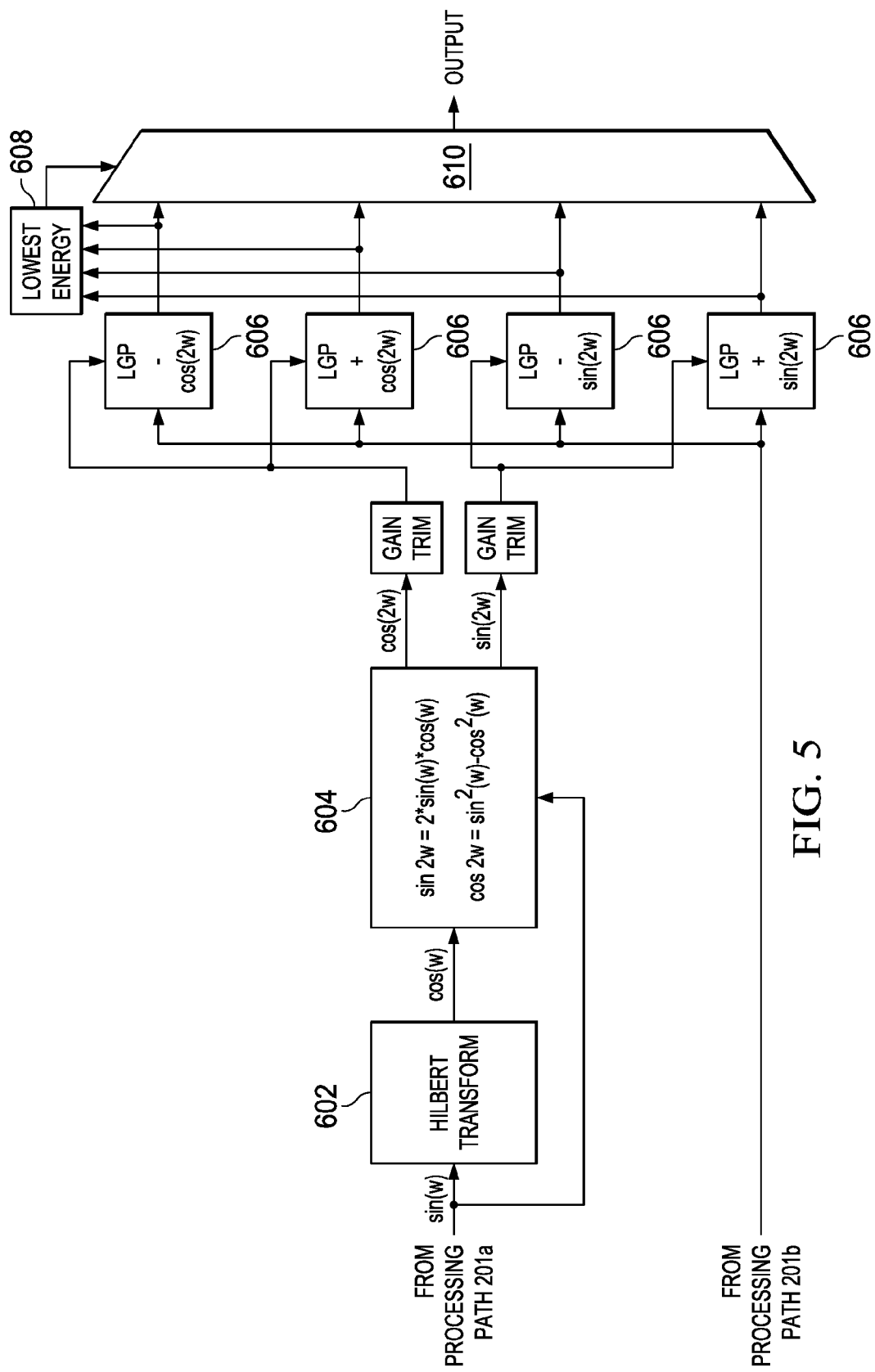
FIG. 5 illustrates a block diagram of an example linear correction circuit, in accordance with embodiments of the present disclosure.

FIG. 5 illustrates a block diagram of an example linear correction circuit 235, in accordance with embodiments of the present disclosure. As shown in FIG. 5, from the digital signal generated by processing path 201a, second harmonics of such digital signal may be reconstructed from a Hilbert transform 602 of the digital signal generated by processing path 201a and trigonometric identities applied by block 604. Such identities may be combined with the digital signal generated by processing path 201a at respective blocks 606, and the combination having the lowest signal energy as determined by block 608 may be selected by multiplexer 610 as the digital correction signal to be output by linear correction circuit 235.

Figure 6:
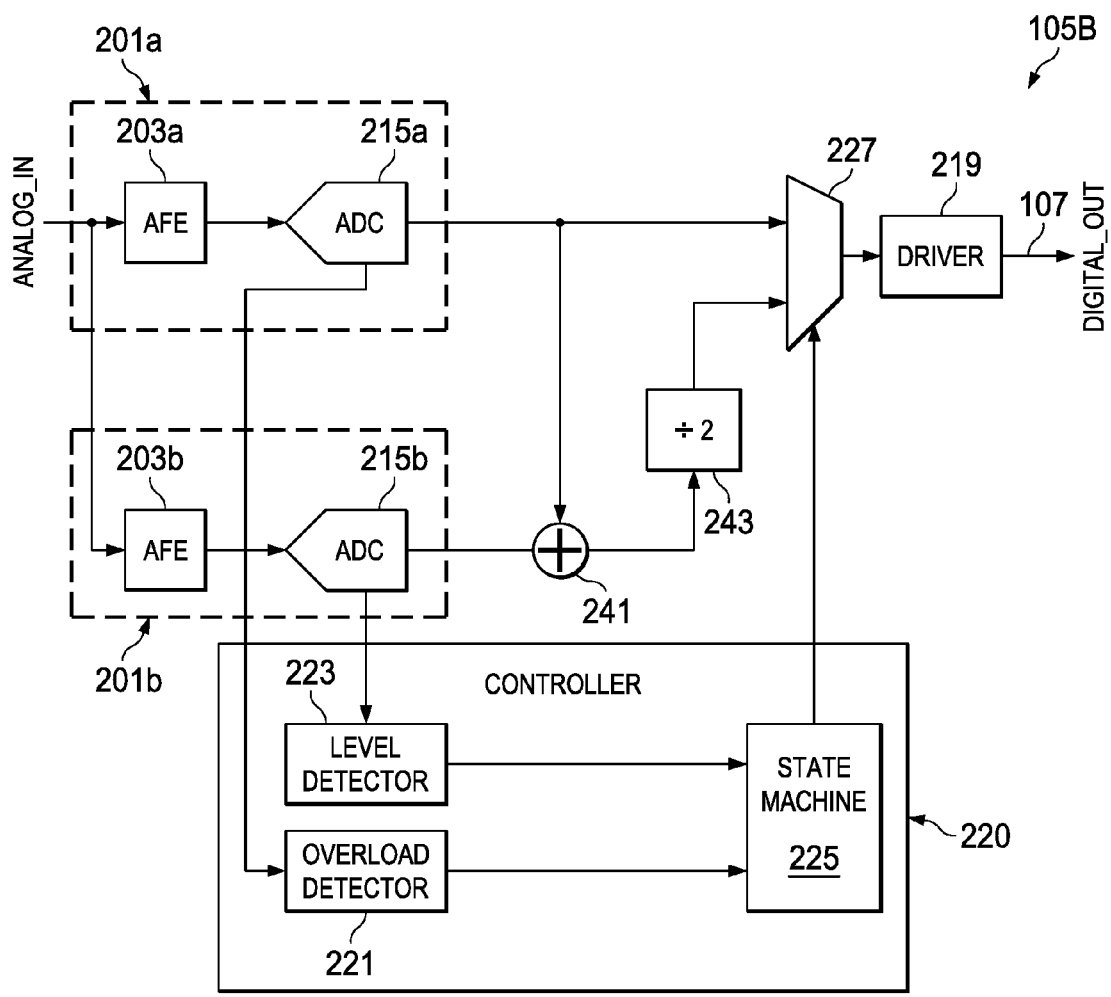
FIG. 6 illustrates a block diagram of selected components of another integrated circuit for processing an analog signal to generate a digital signal, in accordance with embodiments of the present disclosure.

FIG. 6 illustrates a block diagram of selected components of integrated circuit 105B, in accordance with embodiments of the present disclosure. Integrated circuit 105B as shown in FIG. 6 may be in many respects similar to integrated circuit 105 depicted in FIGS. 2 and 3, and thus only the significant differences between integrated circuit 105B and integrated circuit 105 may be described with respect to the discussion of FIG. 6. In particular, integrated circuit 105B may not include adaptive filter 229, combiner 231, and/or error monitor 233 of integrated circuit 105 depicted in FIGS. 2 and 3. However, integrated circuit 105B may include a dynamic range enhancement subsystem comprising a combiner 241 and a divider 243.

Combiner 241 may receive a respective digital signal from each of processing paths 201 and may generate a combined signal representing a sum of the digital signals generated by processing paths 201.

Divider 243 may receive the combined signal generated by combiner 241 and divide such signal by 2 in order to generate a corrected digital signal which is the average of the digital signals generated by processing paths 201.

Controller 220 may, based on one or more parameters (e.g., signals output by overload detector 221, level detector 223, etc.) select either the digital signal generated by processing path 201a as digital output signal DIGITAL_OUT or the corrected digital signal generated by the dynamic range enhancement subsystem of combiner 241 and divider 243. For example, when the magnitude of analog input ANALOG_INPUT is greater than a threshold magnitude, controller 220 may select the corrected digital signal generated by the dynamic range enhancement subsystem as digital output signal DIGITAL_OUT. On the other hand, when the magnitude of analog input ANALOG_INPUT is lesser than a threshold magnitude, controller 220 may select the digital signal generated by processing path 201a as digital output signal DIGITAL_OUT. Thus, whenever controller 220 selects the corrected digital signal generated by the dynamic range enhancement subsystem as digital output signal DIGITAL_OUT, processing path 201a may still be utilized to enhance the dynamic range of processing path 201b.

In some embodiments, to further improve the dynamic range of the processing system implemented by integrated circuit 105B, the analog gain and digital gain of processing path 201a (e.g., the analog gain of non-inverting amplifier 304 and the digital gain of digital gain element 310a) may be reconfigured by gain control signals generated by state machine 225 based on whether controller 220 selects the corrected digital signal generated by the dynamic range enhancement subsystem as digital output signal DIGITAL_OUT or selects the digital signal generated by processing path 201a as digital output signal DIGITAL_OUT. For example, when controller 220 selects the corrected digital signal generated by the dynamic range enhancement subsystem as digital output signal DIGITAL_OUT, controller 220 may set the analog gain of processing path 201a substantially equal to the analog gain of processing path 201b (and correspondingly increase the digital gain of processing path 201a to provide a unity gain for all of processing path 201a). Furthermore, when the magnitude of analog input signal ANALOG_IN is lesser than the threshold magnitude, the analog gain of processing path 201a may be set substantially larger than the analog gain of processing path 201b, thus allowing processing path 201a to more effectively process the lower-magnitude signal when its output is selected as digital output signal DIGITAL_OUT.

Although the discussion above contemplates integrated circuit 105 of FIG. 2, integrated circuit 105A of FIG. 4, and integrated circuit 105B of FIG. 6 as different implementations for integrated circuit 105 depicted in FIG. 1, in some embodiments, an integrated circuit may include any combination of the adaptive filtering approach depicted in integrated circuit 105 of FIG. 2, the linear correction subsystem depicted in integrated circuit 105A of FIG. 4, and/or the dynamic range enhancement subsystem depicted in integrated circuit 105B of FIG. 6. For example, in some embodiments, an integrated circuit may include both the linear correction subsystem depicted in integrated circuit 105A of FIG. 4 and the dynamic range enhancement subsystem depicted in integrated circuit 105B of FIG. 6. In such a scenario, either of the linear correction subsystem depicted in integrated circuit 105A of FIG. 4 or the dynamic range enhancement subsystem depicted in integrated circuit 105B of FIG. 6 could be applied based on characteristics of analog input signal ANALOG_IN. To further illustrate, if a magnitude of analog input signal ANALOG_IN is lesser than a first threshold level, controller 220 may select the digital signal generated by processing path 201a as digital output signal DIGITAL_OUT. However, if the magnitude of analog input signal ANALOG_IN is greater than the first threshold level but lesser than a second threshold level, controller 220 may select the digital signal generated by the dynamic range enhancement subsystem of FIG. 6 as digital output signal DIGITAL_OUT. Further, if the magnitude of analog input signal ANALOG_IN is greater than the second threshold level, controller 220 may select the digital signal generated by the linear correction subsystem of FIG. 4 as digital output signal DIGITAL_OUT.

For the purposes of the remainder of the detailed description of this application, the phrases "the digital output signal of ADC 215b" and "the digital output signal of processing path 201b" may generally refer to such digital output signal or a derivative thereof, such as, for example, the digital signal generated by adaptive filter 229 of integrated circuit 105, the digital signal generated by the linear correction subsystem of integrated circuit 105A, or the digital signal generated by the dynamic range enhancement subsystem of integrated circuit 105B.

Despite a designer's best efforts to match the first path gain and the second path gain, process variations, temperature variations, manufacturing tolerances, and/or other variations may lead to the first path gain and the second path gain being unequal. If switching between paths occurs when such path gains are unequal, signal artifacts may occur due to an instantaneous, discontinuous change in magnitude of the digital output signal between two gain levels. For example, in audio signals, such artifacts may include human-perceptible "pops" or "clicks" in acoustic sounds generated from audio signals.

In some embodiments, in order to reduce or eliminate the occurrence of such artifacts when switching selection between the digital output signal of ADC 215a and the digital output signal of ADC 215b, and vice versa, controller 220 may program an additional gain into one or both of processing paths 201 to compensate for differences in the first path gain and second path gain. This additional gain factor may equalize the first path gain and the second path gain. To illustrate, controller 220 may determine a scale factor indicative of the magnitude of difference (e.g., whether an intentional difference or unintentional mismatch) between the first path gain of processing path 201a and the second path gain of processing path 201b. The controller may determine the first path gain and the second path gain by comparing the digital output signals of each processing path to analog input signal ANALOG_IN or a derivative thereof. If such digital output signals have been filtered by a high-pass filter (e.g., high-pass filters 312), a direct-current offset between the signals may be effectively filtered out, which may be necessary to accurately compute the relative path gains. Controller 220 may determine the scale factor by calculating one of a root mean square average of the first path gain and the second path gain and a least mean squares estimate of the difference between the first path gain and the second path gain. Prior to switching selection between the first digital signal generated by ADC 215a and the second digital signal generated by ADC 215b (or vice versa), controller 220 may program an additional gain into one of processing paths 201 to compensate for the gain difference indicated by the scale factor. For example, controller 220 may calibrate one or both of the first path gain and the second path gain by applying a gain equal to the scale factor or the reciprocal of the gain factor (e.g., 1/gain factor), as appropriate. Such scaling may be performed by modifying one or both of digital gains 310. In some embodiments, controller 220 may apply the additional gain to the processing path 201 of the digital signal not selected as digital output signal DIGITAL_OUT. For example, controller 220 may apply the additional gain to processing path 201a when the digital signal of ADC 215b is selected as digital output signal DIGITAL_OUT and apply the additional gain to processing path 201b when the digital signal of ADC 215a is selected as digital output signal DIGITAL_OUT.

In some embodiments, the additional gain, once applied to a path gain of a processing path 201, may be allowed over a period of time to approach or "leak" to a factor of 1, in order to constrain the additional gain and compensate for any cumulative (e.g., over multiple switching events between digital signals of ADCs 215) bias in the calculation of the additional gain. Without undertaking this step to allow the additional gain to leak to unity, multiple switching events between paths may cause the gain factor to increase or decrease in an unconstrained manner as such additional gain, if different than unity, affects the outputs of the multiple paths and thus affects the calculation of the scaling factor.

In some embodiments, switching selection of digital output signal DIGITAL_OUT from the digital signal of ADC 215a to the digital signal of ADC 215b (or vice versa), may occur substantially immediately. However, in some embodiments, to reduce or eliminate artifacts from occurring when switching selection of digital output signal DIGITAL_OUT from the digital signal of ADC 215a to the digital signal of ADC 215b (or vice versa), controller 220 and multiplexer 227 may be configured to transition continuously or in steps digital output signal DIGITAL_OUT from a first digital signal to a second digital signal such that during such transition, digital output signal DIGITAL_OUT is a weighted average of the first digital signal and the second digital signal wherein a weight of the second digital signal relative to a weight of the first digital signal increases during the transition. For example, if a transition is desired between digital signal of ADC 215a and digital signal of ADC 215b as digital output signal DIGITAL_OUT, such transition may be in steps, wherein in each step, controller 220 and/or multiplexer 227 weighs digital signals output by ADCs 215 as follows:

1) 100% digital signal of ADC 215a and 0% digital signal of ADC 215b;
2) 80% digital signal of ADC 215a and 20% digital signal of ADC 215b;
3) 60% digital signal of ADC 215a and 40% digital signal of ADC 215b;
4) 30% digital signal of ADC 215a and 70% digital signal of ADC 215b;
5) 10% digital signal of ADC 215a and 90% digital signal of ADC 215b; and
6) 0% digital signal of ADC 215a and 100% digital signal of ADC 215b.

As another example, if a transition is desired between digital signal of ADC 215b and digital signal of ADC 215a as digital output signal DIGITAL_OUT, such transition may be in steps, wherein in each step, controller 220 and/or multiplexer 227 weighs digital signals output by ADCs 215 as follows:

1) 100% digital signal of ADC 215b and 0% digital signal of ADC 215a;
2) 70% digital signal of ADC 215b and 30% digital signal of ADC 215a;
3) 60% digital signal of ADC 215b and 40% digital signal of ADC 215a;
4) 20% digital signal of ADC 215b and 80% digital signal of ADC 215a;
5) 5% digital signal of ADC 215b and 95% digital signal of ADC 215a; and
6) 0% digital signal of ADC 215b and 100% digital signal of ADC 215a.

In some embodiments, a transition in digital output signal DIGITAL_OUT (either continuously or in steps) from the digital signal of ADC 215a to the digital signal of ADC 215b (or vice versa) may occur over a defined maximum duration of time. In these and other embodiments, when transitioning (either continuously or in steps) digital output signal DIGITAL_OUT from the digital signal of ADC 215b to the digital signal of ADC 215a, a rate of transition may be based on a magnitude of analog input signal ANALOG_IN (e.g., the rate of transition may be faster at lower amplitudes and slower at higher amplitudes). In such embodiments, the minimum rate of such transition may be limited such that the transition occurs over a defined maximum duration of time, wherein the maximum duration of time is independent of the magnitude of the analog input signal.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A processing system comprising:
    a plurality of processing paths including a first processing path and a second processing path, wherein:
        the first processing path is configured to generate a first digital signal based on an analog input signal; and
        the second processing path is configured to generate a second digital signal based on the analog input signal;
    an adaptive filter configured to generate a filtered digital signal from the second digital signal and adapt its response to reduce a magnitude of an error signal equal to the filtered digital signal subtracted from the first digital signal; and
    a controller configured to select one of the first digital signal and the filtered digital signal as a digital output signal of the processing system based on a magnitude of the analog input signal.

2. The processing system of claim 1, wherein:
    the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into the first digital signal; and
    the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into the second digital signal, and further wherein a magnitude of the gain of the first analog front end is substantially larger than a magnitude of a gain of the second analog front end.

3. The processing system of claim 1, the controller further configured to:
    when the magnitude of the analog input signal is greater than a threshold magnitude, select the filtered digital signal as the digital output signal; and
    when the magnitude of the analog input signal is lesser than the threshold magnitude, select the first digital signal as the digital output signal.

4. A method comprising:
    processing an analog input signal with a first processing path configured to generate a first digital signal based on the analog input signal;
    processing the analog input signal with a second processing path configured to generate a second digital signal based on the analog input signal;
    adapting a response of an adaptive filter configured to generate a filtered digital signal from the second digital signal to reduce a magnitude of an error signal equal to the filtered digital signal subtracted from the first digital signal; and selecting one of the first digital signal and the filtered digital signal as a digital output signal of the processing system based on a magnitude of the analog input signal.

5. The method of claim 4, wherein:

the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into the first digital signal; and the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into the second digital signal, and further wherein a magnitude of the gain of the first analog front end is substantially larger than a magnitude of a gain of the second analog front end.

6. The method of claim 4, further comprising:

when the magnitude of the analog input signal is greater than a threshold magnitude, selecting the filtered digital signal as the digital output signal; and when the magnitude of the analog input signal is lesser than the threshold magnitude, selecting the first digital signal as the digital output signal.

7. A processing system comprising:

a plurality of processing paths including a first processing path and a second processing path, wherein:
 the first processing path is configured to generate a first digital signal based on an analog input signal; and
 the second processing path is configured to generate a second digital signal based on the analog input signal; and a linear correction subsystem configured to determine nonlinearities present in the second processing path based on comparison of the first digital signal and the second digital signal and apply a linear correction to the second digital signal to generate a corrected second digital signal with decreased nonlinearity from that of the second digital signal.

8. The processing system of claim 7, wherein:

the first processing path comprises a first analog front end and a first digital processing subsystem having a first analog-to-digital converter, wherein the first analog front end is configured to amplify the analog input signal in accordance with a first analog gain in order to generate a first amplified analog signal and the first analog-to-digital converter is configured to convert the first amplified analog signal into the first digital signal; and the second processing path comprises a second analog front end and a second digital processing subsystem having a second analog-to-digital converter, wherein the second analog front end is configured to amplify the analog input signal in accordance with a second analog gain to generate a second amplified analog signal and the second analog-to-digital converter is configured to convert the second amplified analog signal into the second digital signal; and the processing circuit further comprises a controller configured to set the first analog gain based on a magnitude of the analog input signal.

9. The processing system of claim 8, wherein the controller is further configured to:

when the magnitude of the analog input signal is greater than a threshold magnitude, set the first analog gain substantially smaller than the second analog gain and select the corrected second digital signal as a digital output signal of the processing system; and when the magnitude of the analog input signal is lesser than the threshold magnitude, set the first analog gain substantially larger than the second analog gain and select the first digital signal as the digital output signal.

10. A method comprising:

processing an analog input signal with a first processing path configured to generate a first digital signal based on the analog input signal;

processing the analog input signal with a second processing path configured to generate a second digital signal based on the analog input signal;

determining nonlinearities present in the second processing path based on comparison of the first digital signal and the second digital signal; and applying a linear correction to the second digital signal to generate a corrected second digital signal with decreased nonlinearity from that of the second digital signal.

11. The method of claim 10, wherein:

the first processing path comprises a first analog front end and a first digital processing subsystem having a first analog-to-digital converter, wherein the first analog front end is configured to amplify the analog input signal in accordance with a first analog gain in order to generate a first amplified analog signal and the first analog-to-digital converter is configured to convert the first amplified analog signal into the first digital signal; and the second processing path comprises a second analog front end and a second digital processing subsystem having a second analog-to-digital converter, wherein the second analog front end is configured to amplify the analog input signal in accordance with a second analog gain to generate a second amplified analog signal and the second analog-to-digital converter is configured to convert the second amplified analog signal into the second digital signal; and the method further comprising setting the first analog gain based on a magnitude of the analog input signal.

12. The method of claim 11, further comprising:

when the magnitude of the analog input signal is greater than a threshold magnitude, setting the first analog gain substantially smaller than the second analog gain and selecting the corrected second digital signal as a digital output signal of the processing system; and when the magnitude of the analog input signal is lesser than the threshold magnitude, setting the first analog gain substantially larger than the second analog gain and selecting the first digital signal as the digital output signal.

* * * * *